(12) United States Patent
Weaver

(10) Patent No.: US 7,079,056 B2
(45) Date of Patent: Jul. 18, 2006

(54) METHOD OF ENCODING AND STORING IN A MACHINE CONTROL COMPUTER A COMPRESSED DATA LOOKUP TABLE

(75) Inventor: Richard A Weaver, Brighton, MI (US)

(73) Assignee: Delphi Technologies, Inc., Troy, MI (US)

( * ) Notice: Subject to any disclaimer, the term of this patent is extended or adjusted under 35 U.S.C. 154(b) by 494 days.

(21) Appl. No.: 10/342,493

(22) Filed: Jan. 15, 2003

(65) Prior Publication Data

US 2004/0139099 A1 Jul. 15, 2004

(51) Int. Cl.
- H03M 7/00 (2006.01)
- G06F 7/00 (2006.01)
- G06F 17/00 (2006.01)
- G06F 13/12 (2006.01)
- G06F 13/38 (2006.01)

(52) U.S. Cl. .................... 341/106; 707/101; 710/68
(58) Field of Classification Search ................ 341/87, 341/51, 59, 106; 707/101; 708/203; 235/494; 251/129.04; 358/1.13; 477/110, 160; 701/33, 701/114; 710/68
See application file for complete search history.

(56) References Cited

U.S. PATENT DOCUMENTS

| | | | | |
|---|---|---|---|---|
| 4,623,976 A | * | 11/1986 | Carp et al. ............... 702/90 |
| 4,645,916 A | | 2/1987 | Raisleger ................ 235/494 |
| 5,007,308 A | * | 4/1991 | Narita .................... 477/160 |
| 5,125,072 A | | 6/1992 | Ng ........................ 358/1.13 |
| 5,863,275 A | * | 1/1999 | Nozaki et al. ............ 477/110 |
| 6,505,105 B1 | * | 1/2003 | Allen et al. ............... 701/33 |
| 6,565,064 B1 | | 5/2003 | Smith et al. .......... 251/129.04 |
| 6,877,114 B1 | * | 4/2005 | Allen et al. ............... 714/45 |
| 6,889,132 B1 | * | 5/2005 | Bidner et al. ............. 701/89 |
| 6,925,376 B1 | * | 8/2005 | Li et al. .................. 701/114 |

OTHER PUBLICATIONS

European Search Report dated Mar. 24, 2004 and it's Annex.
"ADOBE Developers Association: TIFF 6.0 Specification" TIFF Revision 6.0, Jun. 3, 1992, pp. 1-121, XP002274833 *p. 13-p. 16*.

* cited by examiner

Primary Examiner—Patrick Wamsley
(74) Attorney, Agent, or Firm—Stefan V. Chmielewski

(57) ABSTRACT

A compressed data table is formed from an uncompressed data table by defining a code description bit structure having a code type and a run length of data items. The code type may be configured to identify byte-length data items, word-length data items and/or one or more user-specified data items. Each run of one or more byte-length, word-length or user-specified data items in the uncompressed data table is represented in the compressed data table with a code description bit structure having an appropriately configured code type and having its run length equal to the number of byte-length, word-length or user-specified data items in the run of one or more byte-length or word-length data items, and in the case of byte-length and word-length data items each code description bit structure is followed in the compressed data table by the one or more byte-length or word-length data items.

4 Claims, 8 Drawing Sheets

UNCOMPRESSED CALIBRATION TABLE

| | | | | | | | |
|---|---|---|---|---|---|---|---|
| 1 | FFFFFFFF FFFFFFFF FFFFFFFF FFFFFFFF FFFFFFFF FFFFFFFF FFFFFFFF<br>FFFFFFFF FFFFFFFF FFFFFFFF FFFFFFFF FFFFFFFF FFFFFFFF FFFFFFFF<br>FFFFFFFF FFFFFFFF FFFFFFFF FFFFFFFF FFFFFFFF FFFFFFFF FFFFFFFF |
| 2 | FFFFFFFF FFFFFFFF FFFFFFFF FFFFFFFF FFFFFFFF FFFFFFFF FFFFFFFF<br>FFFFFFFF FFFFFFFF FFFFFFFF FFFFFFFF FFFFFFFF FFFFFFFF FFFFFFFF<br>FFFFFFFF FFFFFFFF FFFFFFFF FFFFFFFF FFFFFFFF FFFFFFFF FFFFFFFF |
| 3 | FFFFFFFF FFFFFFFF FFFFFFFF FFFFFFFF FFFFFFFF FFFFFFFF FFFFFFFF<br>FFFFFFFF FFFFFFFF FFFFFFFF FFFFFFFF FFFFFFFF FFFFFFFF FFFFFFFF<br>FFFFFFFF FFFFFFFF FFFFFFFF FFFFFFFF FFFFFFFF FFFFFFFF FFFFFFFF |
| 4 | FFFFFFFF FFFFFFFF FFFFFFFF FFFFFFFF 00000276 000001F4 00000172<br>000000BE 00000096 0000007D 00000069 0000005F 00000041 00000037<br>0000001E 00000028 FFFFFFFF FFFFFFFF FFFFFFFF FFFFFFFF FFFFFFFF |
| 5 | FFFFFFFF 00001F40 00000AD2 000005C8 0000033E 00000276 00000174<br>00000172 000000BE 00000096 0000007D 0000004B 00000044 0000003A<br>0000001E 00000028 00000028 0000001A 0000001A FFFFFFFF FFFFFFFF |
| 6 | 00002EE0 0000251C 00000FC8 000008D4 0000051E 000003B6 000002F1<br>000001D1 0000013F 000000E5 000000B4 00000064 00000046 0000003C<br>0000001E 00000028 00000028 0000001A 0000001A 0000001A FFFFFFFF |
| 7 | 000032C8 00002BB4 000014ED 00000B31 00000704 000004FC 0000036D<br>0000025C 00000188 0000012F 000000D8 0000008E 0000006E 00000054<br>00000032 00000028 00000028 0000001A 0000001A 0000001A FFFFFFFF |
| 8 | 00003200 000029ED 0000186E 00000F19 000008BF 000005F9 00000405<br>00000304 000001DB 0000016C 00000124 000000C6 000000A5 00000074<br>00000044 0000003F 0000002D 0000001A 0000001A 0000001A FFFFFFFF |
| 9 | 000036B0 00002D4F 00001DC0 000012EF 00000ADD 00000787 0000055E<br>000003BD 0000024E 000001B8 00000159 000000FD 000000CC 00000097<br>00000065 00000052 00000034 00000023 0000001E 0000001E FFFFFFFF |
| 10 | 00004C2C 000040E8 00002342 000014EC 00000CA5 00000895 00000558<br>000003FB 000002BC 000001F1 0000019F 0000012C 000000ED 000000AD<br>0000006F 0000005F 0000003B 0000002F 00000028 00000028 FFFFFFFF |

COMPRESSED CALIBRATION TABLE

```
0A15150483027601F40172C9BE967D695F
41371E280501871F400AD205C8033E0276
01F40172CBBE967D4B443A1E28281A1A02
892EE0251COFC808D4051E03B602F101D1
013FCBE5B464463C1E28281A1A1A018A32
C82BB414ED0B310704 04FC036D025C0188
012FCAD88E6E543228281A1A1A018B3200
29ED186E0F1908BF05F90405030401DB01
6C0124C9C6A574443F2D1A1A1A018B36B0
2D4F1DC012EF0ADD0787055E03BD024E01
B80159C9FDCC97655234231E1E018C4C2C
40E8234214EC0CA50895055803FB02BC01
F1019F012CC8EDAD6F5F3B2F282801
``` ~70

FIG. 6A

ROW
DESCRIPTION
ARRAY

| |
|---|
| 02 |
| 02 |
| 02 |
| 03 |
| 16 |
| 33 |
| 53 |
| 74 |
| 96 |
| B8 |

METHOD OF ENCODING AND STORING IN A MACHINE CONTROL COMPUTER A COMPRESSED DATA LOOKUP TABLE

TECHNICAL FIELD

The present invention relates generally to techniques for compressing data, and more specifically to techniques for forming a compressed data table from an uncompressed data table.

BACKGROUND OF THE INVENTION

Calibration data tables in automotive applications typically represent a collection of discrete values that approximate a desired analog function. In order to more closely approximate the analog function in practice, known data interpolation techniques are typically used to determine calibration data that falls between the discrete table entries, and in a two-dimensional table, such interpolation requires knowledge of foul adjacent table entries. For example, if data entries in a particular calibration data table are designated as "D", then data items $D_{i,j}$, $D_{i,j+1}$, $D_{i+1,j}$ and $D_{i+1,j+1}$ will be required to interpolate data values between rows i and i+1 and columns j and j+1.

Data tables in general can be quite large and therefore require a significant amount of memory capacity for storage thereof. It is accordingly desirable to compress such data tables into smaller blocks of data that consume less memory. It is also desirable with compressed calibration data tables to preserve the ability to quickly and efficiently retrieve adjacent table entries for data interpolation as just described. The present invention is directed to data table compression techniques designed to achieve each of these goals, both separately and in combination.

SUMMARY OF THE INVENTION

The present invention comprises one or more of the following features or combinations thereof. A method of forming a compressed data table from an uncompressed data table, wherein the compressed data table may be stored in a computer readable medium. The compressed data table may be based on a code description bit structure including a first number of bits defining a code type and a second number of bits defining a run length of data items.

A first code descriptor may be defined as the code description bit structure having its first number of bits configured to define a bytecode code type identifying byte-length data items, and each run of one or more byte-length data items in the uncompressed data table may be represented in the compressed data table with the first code descriptor having its run length equal to the number byte-length data items in the run of one or more byte-length data items followed by the one or more byte-length data items. A second code descriptor may he defined as the code description bit structure having its first number of bits configured to define a wordcode code type identifying word-length data items, and each run of one or more word-length data items in the uncompressed data table may be represented in the compressed data table with the second code descriptor having its run length equal to the number of word-length data items in the run of one or more word-length data items followed by the one or more word-length data items. A third code descriptor may be defined as the code description bit structure having its first number of bits configured to define a first shortcode code type identifying a first specified data item, and each run of one or more of the first specified data items in the uncompressed data table may be represented in the compressed data table with the third code descriptor having its run length equal to the number of the first specified data items in the run of one or more of the first specified data items. A fourth code descriptor may be defined as the code description bit structure having its first number of bits configured to define a second shortcode code type identifying a second specified data item different than the first specified data item, and each run of one or more of the second specified data items in the uncompressed data table may be represented in the compressed data table with the fourth code descriptor having its run length equal to the number of the second specified data items in the run of one or more of the second specified data items. The code description bit structure may a byte-length code description byte, or alternatively be defined by any number of bits.

The compressed data table may define a header, wherein the header includes a first number of bits defining the number of rows in the uncompressed data table and a second number of bits defining the number of columns in the uncompressed data table. The header may further include a third number of bits defining a specified data item identified by a shortcode code type. Alternatively, the compressed data table may not include a header, and the first item in the compressed data table may instead comprise a predefined number of bits defining the first number of rows and the second number of columns.

A row description array may be defined and stored in the computer readable medium, and the array may include a number of row identifiers equal to the number of rows in the uncompressed data table, with each of the row identifiers identifying a corresponding one of the code descriptors contained in the compressed data table that defines the first element in the corresponding row of the uncompressed data table.

A search algorithm may be stored in the computer readable medium, and may be configured to retrieve data items from the compressed data table corresponding to data items in specified rows and columns of the uncompressed data table by first locating appropriate ones of the first, second or third code descriptors in the compressed data table identified by row identifiers corresponding to the specified rows, and then processing at least the appropriate ones of the first, second or third code descriptors to locate the data items in the compressed data table that correspond to those in the specified columns of the uncompressed data table.

The uncompressed data table may be a calibration table including data for controlling at least one function associated with a motor vehicle.

These and other features of the present invention will become more apparent from the following description of the illustrative embodiments.

BRIEF DESCRIPTION OF THE DRAWINGS

FIG. 5 is an example of an uncompressed calibration data table.

FIG. 6A is a compressed representation of the calibration data table of FIG. 5 using an arrangement of code description bytes of the type illustrated in FIG. 2.

FIG. 6B is a row description array including row identifiers mapping the first data element in each row of the uncompressed data table of FIG. 5 with corresponding data elements in the compressed data table of FIG. 6A.

DESCRIPTION OF THE ILLUSTRATIVE EMBODIMENTS

Figure 1:
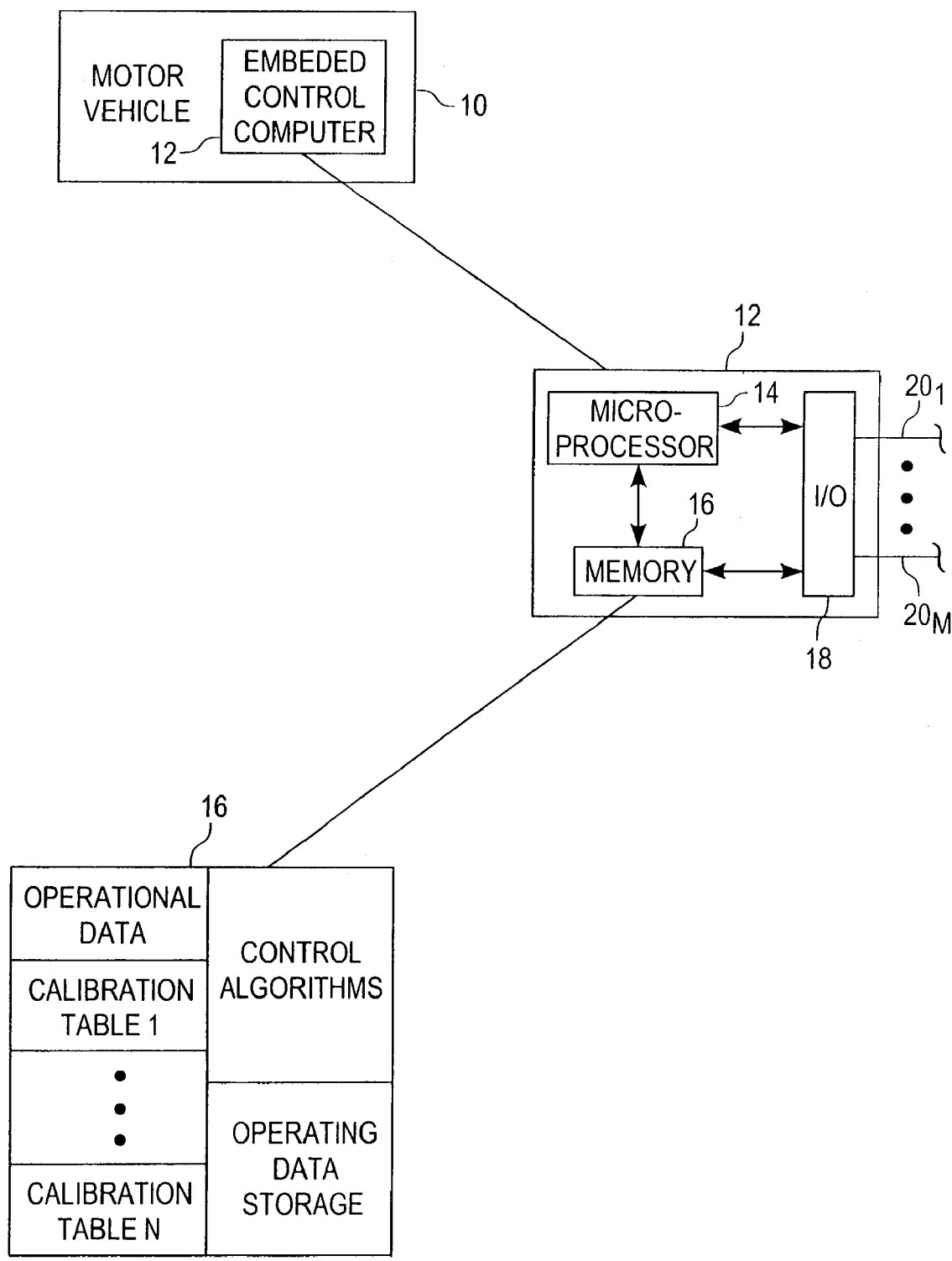
FIG. 1 is a diagrammatic illustration of a control computer embedded within a motor vehicle and having a memory containing one or more calibration data tables.

Referring now to FIG. 1, a diagrammatic illustration of a control computer 12 is shown embedded within a motor vehicle 10. The control computer 12 includes a microprocessor 14 in communication with a memory unit 16, and input/output (I/O) circuitry 18 interfacing the microprocessor 14 and memory unit 16 with external electronic devices and/or systems via a number, M, of signal paths $20_1$–$20_M$, wherein M may be any positive integer.

The memory unit 16 may be configured and/or partitioned for data storage in accordance with any of a variety of known techniques, and in the embodiment illustrated in FIG. 1 the memory unit 16 is configured in a known manner to store therein a number of different information types. For example, memory unit 16 includes a first section or portion configured to store one or more control algorithms for controlling one or more component system or subsystem of the motor vehicle 10. A second section or portion of memory unit 16 is configured to store operating data, wherein such data may include parameter thresholds and/or ranges, parameter default values, and the like, that is used by the one or more control algorithms in controlling the one or more component, system or subsystem of the motor vehicle. A third section or portion of memory unit 16 is configured to collect and store operational data associated with the vehicle and/or any component carried thereby. Such data may include, for example, diagnostic data, trip data, fuel usage data, and/or the like. A fourth section or portion of memory unit 16 is configured to store any number, N, of calibration data tables wherein N may be any positive integer. Each of the calibration data tables typically contains information mapping one or more operating parameters to a particular vehicle function. For example, one particular calibration table may be populated with engine fueling values mapping engine speed and engine load values to specified fueling command values. Other examples will occur to those skilled in the art.

The control computer 12 illustrated in FIG. 1 may represent any of a number of control computers typically embedded within a motor vehicle 10 including, but not limited to, an engine control computer configured to manage and control the overall operation of an internal combustion engine carried by the motor vehicle 10, a power train control computer configured to manage and control the overall operation of the vehicle power train, a transmission control computer configured to manage and control the overall operation of an automatic or semiautomatic transmission carried by the vehicle 10, an anti-lock brake system (ABS) control computer configured to manage and control the operation of the anti-lock brake system, of the like. Those skilled in the art will recognize other control computers that may be embedded within or carried by the motor vehicle 10, and any such other control computers are intended to be generally represented by the control computer 12 illustrated in FIG. 1.

Figure 2:
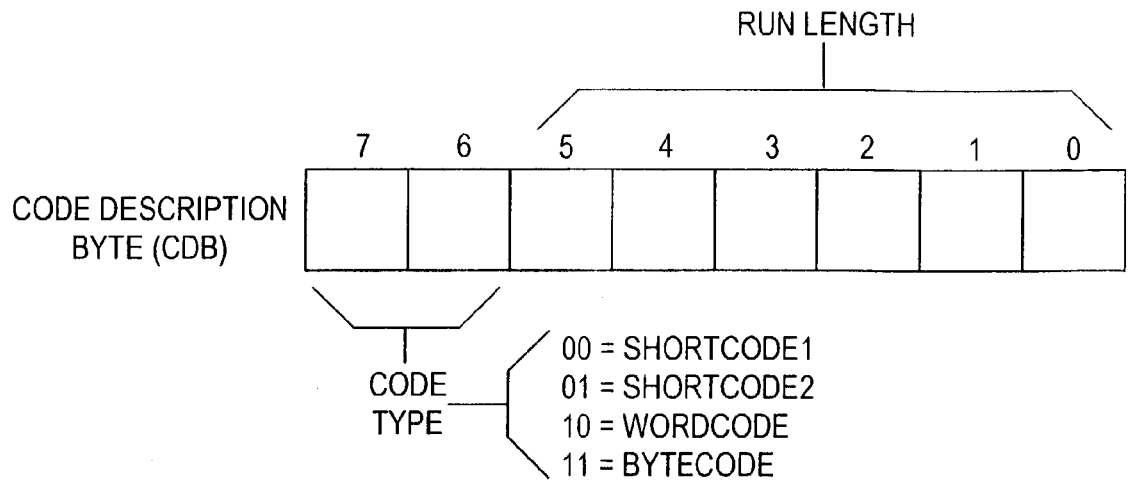
FIG. 2 is a diagram of one illustrative format of a code description byte used to compress data forming a data table.
Figure 3:
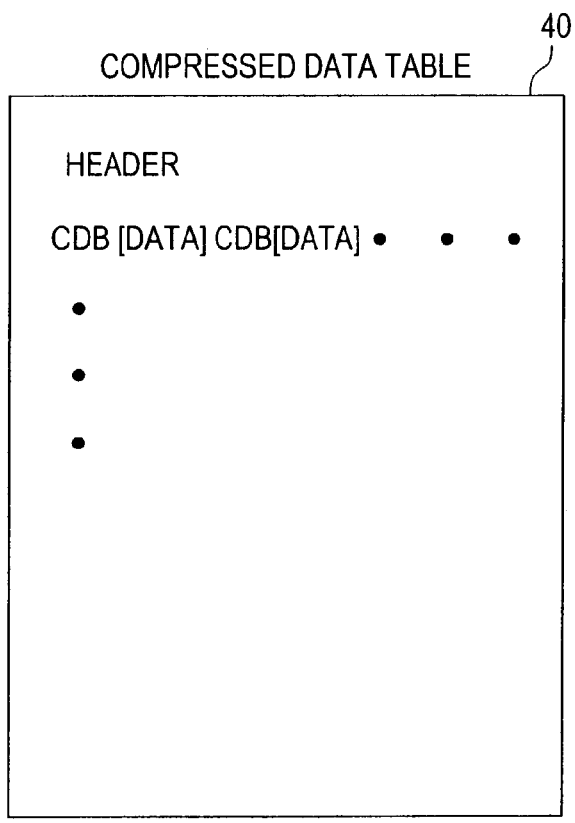
FIG. 3 is a diagram of one illustrative format of a compressed data table using an arrangement of code description bytes of the type illustrated in FIG. 2.
Figure 4:
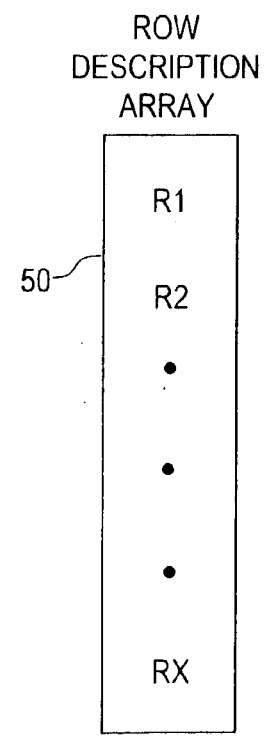
FIG. 4 is a diagram of one illustrative embodiment of a row description array including row identifiers mapping the first data element in each row of an uncompressed data table to their corresponding data elements in the compressed data table of FIG. 3.

Referring to FIG. 2, one illustrative embodiment of a code description byte (CDB, is shown, wherein a collection of such code description bytes may be used to compress a data table to form a smaller block of data that consumes less memory for storage thereof. The code description byte is partitioned into a CODE TYPE and a code RUN LENGTH. The CODE TYPE identifies the type of data that, in some cases, follows the code description byte and the code RUN LENGTH defines the number of data items that follow the code description byte. In the illustrated embodiment, the CODE TYPE is defined by two bits of the code description byte; e.g., bits 6 and 7, and the code RUN LENGTH is defined by the six remaining bits of the code description byte; e.g., bits 0–5. It is to be understood that more or fewer number of bits may be used to define each of the CODE TYPE and the code RUN LENGTH, and/or that the code description byte may alternatively be a code description word consisting of two bytes defining a CODE TYPE and a code RUN LENGTH of any desired number of bits each. The code description bit may accordingly be a code description bit structure of any bit length defining any number of different CODE TYPES and any number of corresponding RUN LENGTHS. In the following description, the code description bit structure will be described in the context of a code description byte, although it will be understood that the code description bit structure may alternatively be smaller or larger than one byte in length as just described. A compressed data table 40 is formed from an uncompressed data table by representing the various uncompressed entries using code description bytes of the type just described, wherein each code description byte may be followed by a number of data entries to form the structure CDB[DATA] CDB[DATA] . . . , as illustrated in FIG. 3.

The CODE TYPE defines specific types of data, and in some cases such data follows the code description byte. The total number of different code types that may be defined is dictated by the number of bits used to represent the code type in the code description byte. In the illustrated embodiment, for example, the CODE TYPE is defined by two bits; namely bits 6 and 7, of the code description byte and may accordingly define up to four different types of data. Each of the code types define a specific data format, and in the embodiment illustrated in FIG. 2, a first code descriptor having a CODE TYPE 11 defines a BYTECODE, meaning that data entries following the code description byte in the compressed data table represent BYTE data, and each such data entry will therefore be one byte in length. The number of such data entries that follow the code description byte in the compressed data table is defined by the RUN LENGTH of the code description byte. For example, assume that the following twelve hexadecimal entries occur in succession in an uncompressed data table; 0000E0, 0000FF, 0000A9, 0000B7, 00001A, 000001, 0000D8, 0000C9, 000015, 000022, 00006C, 00004D. All twelve entries represent BYTECODE data, and the code description byte for such data would thus be "11" in bits 6 and 7 to represent a CODE TYPE corresponding to BYTECODE data, and "001100" in bits 0–5 to represent a RUN LENGTH of 12 single byte data entries following the code description byte. In hexadecimal, the code description byte would thus be "CC", and the representation of the example uncompressed BYTECODE data string in a compressed data table would be of the form CDB[DATA] or CCE0FFA9B71A01D8C915226C4D.

In the illustrated embodiment, a second code descriptor having a CODE TYPE 10 defines a WORDCODE, meaning that data entries following the code description byte in the compressed data table represent WORD data, and each such data entry will therefore be two bytes in length. As with BYTECODE data, the number of such data entries that follow the code description byte in the compressed data table is defined by the RUN LENGTH of the code description byte. For example, assume that the following five hexadecimal entries occur in succession in an uncompressed data table; 0018E0, 0024FF, 0A9A9, 0045B7, 00F41A. All five entries represent WORDCODE data, and the code description byte for such data would thus be "10" in bits 6 and 7 to represent a CODE TYPE corresponding to BYTECODE data, and "000101" in bits 0–5 to represent a RUN LENGTH of five double byte data entries following the code description byte. In hexadecimal, the code description byte would thus be "85", and the representation of the example uncompressed WORDCODE data string in a compressed data table would be of the form CDB[DATA] or 8518E024FFA9A945B7F41A.

In the embodiment illustrated in FIG. 2, a third code descriptor having a CODE TYPE 00 defines a first short code, SHORTCODE1, and fourth code descriptor having a CODE TYPE 01defines a second short code, SHORTCODE2. SHORTCODE1 and SHORTCODE2 are each user definable data types that may be used to define particular strings of data not definable by any other CODE TYPE and/or that may occur with some frequency in the uncompressed data table. For example, a data string that may be too large to define by either a BYTECODE or WORDCODE CODETYPE may instead be defined as SHORTCODE1 or SHORTCODE2. As illustrated generally in FIG. 3, the compressed data table 40 may include a header, and in one embodiment the header may include indicators of the number of rows and columns in the uncompressed data table as well as code definitions of any short codes defined by one of more code description bytes. In this embodiment, the header may have, for example, the following format: ROWS, COLUMNS, SHORTCODE1LENGTH, SHORTCODE1, SHORTCODE2LENGTH, SHORTCODE2, wherein SHORTCODE1LENGTH and SHORTCODE2LENGTH are byte length indicators of the bit lengths of each of SHORTCODE1 and SHORTCODE2 respectively.

As an example, consider an uncompressed data table having 10 rows (0A hexadecimal) and 20 columns (14 hexadecimal), and one hexadecimal entry of the form EAAEFBB (28 bits in length, or "1C" hexadecimal) that occurs nine times in succession in the uncompressed data table and another hexadecimal entry of the form FDFACB (24 bits in length, or us "18" hexadecimal that occurs 4 times in succession in the uncompressed data table. Since these data strings are each too large to represent as BYTECODE or WORDCODE CODE TYPES, the first is defined as SHORTCODE1 and the second as SHORTCODE2. The header of the compressed data table 40 in the embodiment described above is then 0A141CEAAEFFBB18FDFACB. Alternatively, the header may include only indicators of the number of rows and columns in the uncompressed data table; e.g., 0A14 in the above example, and the definitions of any short codes may be passed as variables to a data retrieval algorithm configured to retrieve data from the compressed data table 40. Alternatively still, the header may be omitted from the compressed data table 40, and the indicators of the number of rows and columns in the uncompressed data table may be included as the first item in the compressed data table itself, and the definitions of any short codes may be passed as variables to the data retrieval algorithm. In this embodiment, the first item in the compressed data table 40 comprising the number of rows and columns in the uncompressed data table may be defined by any number of bits in any desired format. For example, a first number of bits of the first data item in the compressed data table 40 may define the number of rows in the uncompressed data table, and a second number of following bits may define the number of columns in the uncompressed data table. In the above example, the first item in the compressed data table 40 may be the word-length data item "0A14", wherein "0A" indicates that the uncompressed data table has 10 rows of uncompressed data and "14" indicates that the uncompressed data table has 20 columns of uncompressed data.

In any case, a code description byte defining any short code will generally not be followed in the compressed data table 40 by any data since the data is already defined by the short code itself. The actual short code data may be found in the header of table 40, or passed as a variable to a data retrieval algorithm as just described. Thus, in the example given above a code description byte for EAAEFBB that occurs nine times in succession in the uncompressed data table, and which is defined as SHORTCODE1, is represented in the compressed data table 40 simply as "09" (bits 7 and 6 respectively of the code description byte are "00", and bits 5–0 respectively are "001001", or "09" hexadecimal). Similarly, a code description byte for FDFACB that occurs four times in succession, and which is defined as SHORTCODE2, is represented in the compressed data table 40 simply as "44" (bits 7 and 6 respectively of the code description byte are "01" and bits 5–0 respectively are "000100", or "44" hexadecimal).

As described hereinabove, the code description byte may be configured to define any number of different CODE TYPES and RUN LENGTHS, and those skilled in the art will recognize that the number of different CODE TYPES and the allowable size of the RUN LENGTH may vary depending upon the application, and will generally be dictated by the size of the uncompressed data table and the nature of its contents. As one example, the code description byte illustrated in FIG. 2 is configured to allow for two user definable short codes, in addition to a WORDCODE and a BYTECODE, and to allow for RUN LENGTHS of Up to 64 (e.g., six available bits, or $2^6$). As another example, the code description byte may be configured to allow three bits to define the CODE TYPE and five bits to define the RUN LENGTH. In this example, the code description byte is configured to allow for six user definable short codes, in addition to a WORDCODE and a BYTECODE, and to allow for RUN LENGTHS of up to 32 (e.g., five available bits, or $2^5$). Those skilled in the art will recognize other configurations of the code description byte, and such other configurations are intended to fall within the scope of the present invention. Alternatively still, the code description byte may be replaced by a code description structure having fewer than eight bits, or replaced by a code description byte-bit combination, word, word-bit or word-byte combination, or combination of words having more than eight bits. In such cases, any number of bits or bytes may accordingly be used to define the number of different CODE TYPES and the RUN LENGTH.

In any case, a compressed data table 40 resulting from the foregoing data compression technique is stored in memory 16 (FIG. 1) as block of data that may in some embodiments be preceded by a header as just described. To facilitate retrieval of data from the compressed data table 40 that corresponds to data in specific locations in the uncompressed data table, it is desirable to identify in the compressed data table 40 the various entries that define the first data elements in each of the rows of the uncompressed data table. This is accomplished with a row description array, and one illustrative embodiment of such an array 50 is illustrated in FIG. 5. The row description array 50 includes "X" row identifiers R1–RX, wherein "X" corresponds to the number of rows in the uncompressed data table. Each row identifier, R1–RX, in the row description array 50 identifies an entry in the compressed data table 40 that defines the first element in the row of the uncompressed data table that corresponds to that row identifier. In the illustrated embodiment, the various groups of entries in the compressed data table 40 that define the individual rows of the uncompressed data table each begin with the code description byte. In other words, the start of each row in the uncompressed data table is entered as a code description byte in the compressed data table. If the CODE TYPE of this code description byte is a short code (e.g., SHORTCODE1 or SHORTCODE2), then the code description byte itself defines the first data element of that row. On the other hand, if the CODE TYPE of the code description byte is a BYTECODE, then the byte following the code description byte defines the first data element of that row, and if the CODE TYPE is instead a WORDCODE, then the two-byte word following the code description byte defines the first data element of that row.

In the above example, the uncompressed data table was identified as having ten rows and 20 columns, and a corresponding row description array 50 will accordingly include ten row identifiers, R1–R10. The first row identifier, R1, points to the location in the compressed data table 40 where the code description byte defining the first data element in the first row of the uncompressed data table may be found. In embodiments of the compressed data table 40 including a header, the header as a whole may be considered to be the first element in the table 40. Alternatively, in embodiments of the compressed data table 40 that do not include a header, the first "item" comprised of a predefined number of bits may be an indicator of the number of rows and columns of uncompressed data in the uncompressed data table. In either such embodiments, the second item in the compressed data table 40 is thus the first code description byte defining the first one or more data items in the first row of the uncompressed data table, and R1 is "02" in this case. In embodiments of the compressed data table 40 that do not include a header and wherein any one or more of the number of rows of data in the uncompressed data table, the number of columns of data in the uncompressed data table, one or more short code run length descriptors and/or one or more short code definitions are passed as variables between data retrieval algorithms, R1 would be "01". Assuming that the second row in the uncompressed data table is not an exact duplicate of the first row, R2 would then point to the code description byte in the compressed data table 40 that defines the first element in the second row of the uncompressed data table, and so forth. However, if the second row of the uncompressed data table is an exact duplicate of the first row, including such data in the compressed data table 40 would be redundant. In such cases, the duplicate row is accounted for via the row description array 50 by simply duplicating the value of R1 as the value of R2. This way, data for the second row of the compressed data table 40 need not be actually entered into the compressed data table 40, since the data duplication is accounted for via the row description array 50. This technique is applied to any number of duplications in any number of rows of the uncompressed data table. In any case, for the purpose of defining and counting the various entries in the row description array 50, data entries or items in the compressed data table 40 are considered to be one byte in length, so that all BYTECODE data entries are counted as one data item and all WORDCODE data entries are counted as two items.

Referring now to FIGS. 5, 6A and 6B, an example is provided to demonstrate compression of a 10-row by 21-column table 60 of calibration data to a significantly smaller compressed calibration table 70 and accompanying row description array 80. In this example, the compressed calibration table 70 will not include a header, and the number of rows and columns of uncompressed data in the uncompressed calibration table 60 will be represented by the first word-length item in the compressed calibration table 70. Since the number of rows of uncompressed data in the uncompressed calibration table 60 is 10, which is "0A" hexadecimal, and the number of columns of uncompressed data in the uncompressed data table 60 is 21, which is "15" hexadecimal, the first item in the compressed calibration table 70 following a ROWS, COLUMNS format is thus "0A15" as illustrated in FIG. 6A.

From FIG. 5, it is seen that the first three rows of the uncompressed calibration table 60 are identical, and each consist of 21 entries of identical data "FFFFFFFF". It is accordingly desirable with such data to define the first short code, SHORTCODE1, as "FFFFFFFF" having a bit length, or SHORTCODE1LENGTH of 32 (hexadecimal 20). All remaining data in the uncompressed calibration table 60 is definable as either a WORDCODE or a BYTECODE, so a second short code definition is not necessary in this case and in this example the SHORTCODE1LENGTH and SHORTCODE1 values are passed as variables between data retrieval algorithms.

The CODE TYPE for SHORTCODE1 is "00", and the RUN LENGTH for the data in each of the three rows is 21 (hexadecimal 15), so the code description byte that defines SHORTCODE1 having a RUN LENGTH of 21 is "15", which is thus the first entry in the compressed calibration table 70 following the header as illustrated in FIG. 6A. Since the first code description byte defines a short code, and the first code description byte follows the header, the entry in the compressed calibration table 70 that defines the first data item in the first row of the uncompressed calibration table 60 is the second item in the compressed calibration table 70 (the first item is the word-length row/column number descriptor "0A15"). The first row identifier in the row description array 80 is accordingly "02". Since the rows two and three of the uncompressed calibration table 60 are identical to the first row, it is unnecessary to define the data items of rows two and three in the compressed calibration table 70 and to instead identify them each as the second item in the compressed calibration table 70. The second and third row identifiers in the row description array 80 are accordingly each "02".

The fourth row of the uncompressed calibration table 60 is defined by four successive SHORTCODE1 data items, followed by three successive WORDCODE data items, followed by nine successive BYTECODE data items, followed by five successive SHORTCODE1 data items. The code description byte for the first four SHORTCODE1 data items is "04", and this is thus the third entry in the compressed calibration table 70 as illustrated in FIG. 6A. The code description byte for three following successive WORDCODE data items is "83" hexadecimal, and the three successive word-length data items are "0276", "01F4" and "0172" respectively. Entries 4–10 in the compressed calibration table 70 are thus "83027601F40172", and it should be noted that since "83" defines three successive WORDCODE data items, the three data entries following the code description byte "83" are each two bytes in length and therefore account for six byte-length data entries in the compressed calibration table 70. The code description byte for the nine following successive BYTECODE data items is "C9" hexadecimal, and the nine successive byte-length data items are "BE", "96", "7D", "69", "5F", "41" "37", "1E" and "28" respectively. Entries 11–20 in the compressed calibration table 70 are thus "C9BE967D695F41371E28". Finally, the code description byte for the five following successive SHORTCODE1 data items that finish out row four of the uncompressed calibration table 60 is "05", and entry 21 in the compressed data table 70 is thus "05". Since this third entry in the compressed calibration table 70 is the code description byte that defines the first data element in the fourth row of the uncompressed calibration table 60, the fourth row identifier in the row description array 80 is thus "03".

Since row four of the uncompressed calibration table 60 ended in the compressed calibration table 70 with item 21, item 22 of the compressed calibration table 70 is the code description byte that defines the first data entry of row five of the uncompressed calibration tale 60. The first data entry in row five of the uncompressed calibration table 60 represents a single occurrence of SHORTCODE1 data, and the code description byte defining item 22 in the compressed calibration table 70 is thus "01" as illustrated in FIG. 6A. Because item 22 of the compressed calibration table 70 defines the first data entry in row five of the uncompressed calibration table 60, the fifth row identifier in the row description array 80 is thus 16 (i.e., "22" decimal corresponds to "16" hexadecimal).

The remaining data entries of the uncompressed calibration table 60 are entered into the compressed calibration table 70, and the row identifiers of the row description array 80 are defined, in like fashion to produce the compressed calibration table 70 and associated row description array 80 illustrated in FIGS. 6A and 6B. Those skilled in the art will recognize that while the construction of the compressed calibration table 70 and row description array 80 from the uncompressed calibration table 60 has been described in the context of a calibration table stored within the memory 16 of a control computer 12 embedded within a motor vehicle 10 (see FIG. 1), the data compression technique used to form the compressed calibration table 70 and row description array 80 may be applied to any suitable data table in any application wherein such a data table is stored in an electronically accessible memory.

Figure 7:
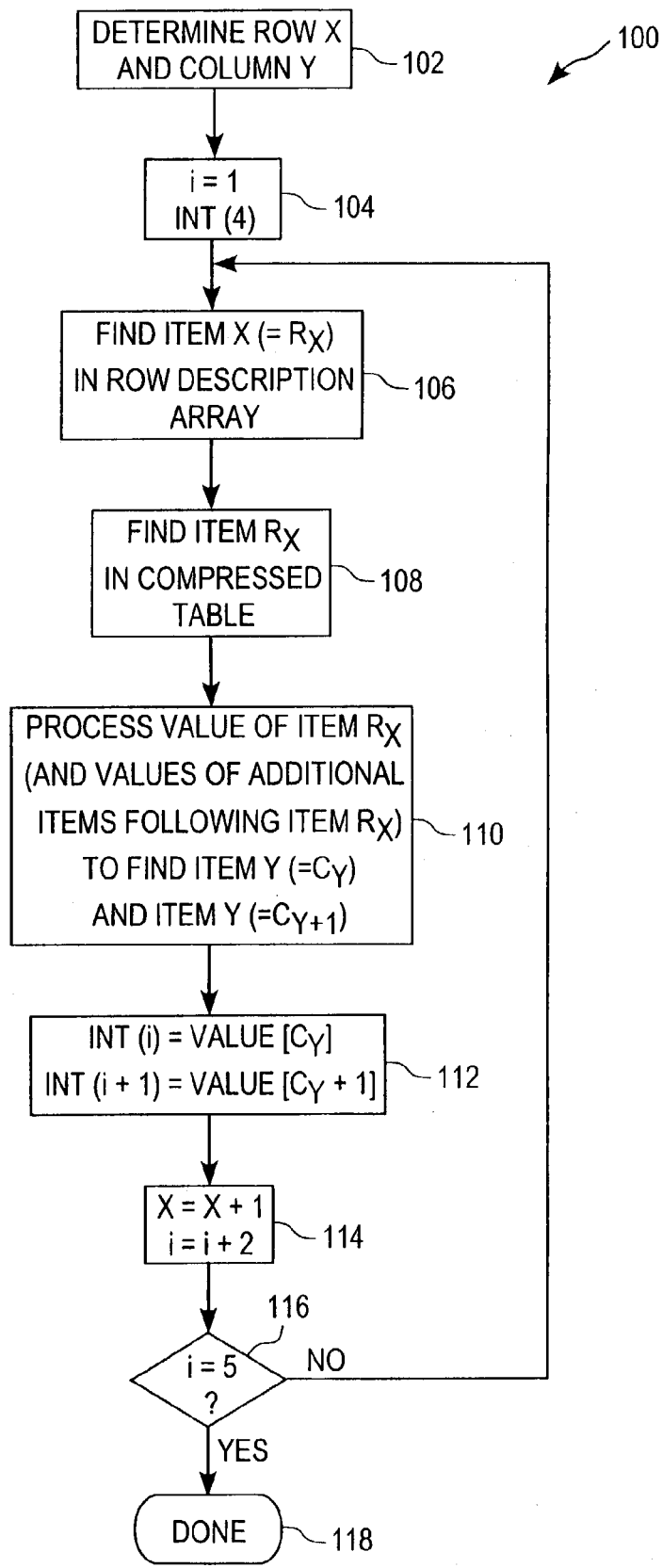
FIG. 7 is a flowchart illustrating one embodiment of an algorithm for locating in the compressed data table of FIG. 6A four adjacent data elements for subsequent interpolation thereof to determine a specific calibration data value.

As described hereinabove in the BACKGROUND section, it is desirable in some applications to retrieve data items from a compressed data table that correspond to adjacently located data items in the uncompressed data table for the purpose of data interpolation or one or more other data approximation functions. FIG. 7 shows a flowchart illustrating one embodiment of a software algorithm 100 for retrieving four data items from the compressed calibration table 70 of FIG. 6A that correspond to four adjacently located data items in the uncompressed calibration table 60 of FIG. 5. Algorithm 100 requires knowledge only of the row-column location of one of the data entries in the uncompressed calibration table 60, and in the embodiment of algorithm 100 illustrated in FIG. 7, that row-column location is the smallest valued row and column combination. Thus, if it is desired to retrieve data items $D_{X,Y}$, $D_{X,Y+1}$, $D_{X+1,Y}$ and $D_{X+1,Y+1}$, algorithm 100 requires as inputs row X and column Y. The choice of this particular row-column location is arbitrary, and those skilled in the art will recognize that algorithm 100 may alternatively be configured to receive as the input row-column combination any of the three remaining row-column combinations. Modification of algorithm 100 to accommodate any such alternate choice of the input row-column combination would be a mechanical step for a skilled artisan.

Algorithm 100 will be described as being executed by the control computer 12, although it will be understood that algorithm 100 may alternatively be executed by any general purpose computer operable as described herein. For the purpose of illustration, algorithm 100 will also be described in the context of an example relating to the uncompressed calibration table 60 of FIG. 5, the compressed calibration table 70 of FIG. 6A and the row description array 80 of FIG. 6B. In this example, the four adjacent data items in the uncompressed calibration table 60 that are to be found in the compressed calibration table 70 are the data items at row 6, columns 4 and 5, and at row 7, columns 4 and 5, which correspond to "000008D4", "0000051E", "00000B31" and "00000704" respectively as highlighted in FIG. 5. It is to be understood that this example is provided only for the purpose of illustrating algorithm 100, and is not intended in any way to limit the scope of the present invention.

Algorithm 100 begins at step 102 where control computer 12 is operable to receive as inputs row X and column Y, the combination of which corresponds to the lowest valued row-column combination where the data sought to be retrieved is located in the uncompressed calibration table 60 as described hereinabove. In the example given, X is thus 6 and Y is 4. Following step 102, algorithm execution advances to step 104 where a counter, i, is set to one and a four-element data array, INT is initialized. Thereafter at step 106, control computer 12 is operable to find item X in the row description array 80. In the example, X is 6, so control computer 12 is operable at step 106 to retrieve the $6^{th}$ row identifier ($R_X$) in the row description array 80, which is "33" hexadecimal as shown in FIG. 6B. The value of the $6^{th}$ row identifier in the row description array 80 is the item number in the compressed calibration table 70 that corresponds to the first entry in the sixth row of the uncompressed calibration table 60.

Following step 106, algorithm execution advances to step 108 where control computer 12 is operable to find item $R_X$ in the compressed calibration table 70. In the example, $R_X$ is hexadecimal "33", which corresponds to decimal "51". At step 106, control computer 12 is thus operable to find the $51^{st}$ item in the compressed calibration table 70 which is "89" as highlighted in FIG. 6A. Following step 108, algorithm 100 advances to step 110 where control computer 12 is operable to process the value of item $R_X$ in the uncompressed calibration table 60, as well as any additional items following item $R_X$, to find items Y and Y+1 in the row that starts with item $R_X$. The value of item Y is referred to as $C_Y$ and the value of item Y+1 is referred to as $C_{Y+1}$. In the example, Y is 4 and Y+1 is 5, and the control computer 12 is accordingly operable at step 110 to process item $R_X$, which is item 51. in the compressed calibration table 70 to find the values of the $4^{th}$ and $5^{th}$ items of the row that begins with item 51. As determined at step 108, the value ($R_X$) of item 51 is hexadecimal "89", and since item 51 begins row 6 of the uncompressed calibration table 60, item 51 must be accordingly be a code description byte. A code description byte having the hexadecimal value "89" converts to "10001001" binary, and referring back to FIG. 2, since bits 7 and 6 of this binary value are "10" and bits 5–0 are "001001", this code description byte is a WORDCODE having nine word-length entries following the code description byte. In this case, since Y and Y+1 (four and five respectively) are both less than the RUN LENGTH of the code description byte "89", items Y and Y+1 thus correspond to the $4^{th}$ and $5^{th}$ words that follow the code description byte "89". $C_Y$ is thus "08D4" and $C_{Y+1}$ is "051C" as i FIG. 6A.

Following step 110, algorithm 100 advances to step 112 where control computer 12 is operable to set the ith (=1 in the first pass of algorithm 100) value of the four-element data array, INT, to $C_Y$, or "08D4" and the i+1th (=2 in the first pass of algorithm 100) value of the four-element data array, INT, to $C_{Y+1}$ or "051E". Thereafter at step 114, control computer 12 increments X by 1 and i by 2 and advances to step 116 to test the value of the "i" counter against the value of 5. Since i=3 after the first pass through step 114, step 116 loops from the "NO" branch back to step 106.

In the second pass through step 106, control computer 12 is operable to find item X in the row description array 80. In the example, X is now 7, and control computer 12 is operable at step 106 to retrieve the $7^{th}$ row identifier ($R_X$) in the row description array 80, which is "53" hexadecimal as shown in FIG. 6B. The value of the $7^{th}$ row identifier in the row description array 80 is the item number in the compressed calibration table 70 that corresponds to the first entry in the seventh row of the uncompressed calibration table 60.

Following step 106, algorithm execution advances to step 108 where control computer 12 is operable to find item $R_X$ in the compressed calibration table 70. In the example, $R_X$ is hexadecimal "53", which corresponds to decimal "83". At step 106, control computer 12 is thus operable to find the $83^{rd}$ item in the compressed calibration table 70 which is "8A" as highlighted in FIG. 6A. Following step 108, algorithm 100 advances to step 101 where control computer 12 is operable to process the value of item $R_X$ in the uncompressed calibration table 60, as well as any additional items following item $R_X$, to find items Y and Y+1 in the row that starts with item $R_X$. The value of item Y is $C_Y$ and the value of item Y+1 is $C_{Y+1}$. In the example, Y is 4 and Y+1 is 5, and the control computer 12 is accordingly operable at step 110 to process item $R_X$, which is item 83, in the compressed calibration table 70 to find the values of the $4^{th}$ and $5^{th}$ items of the row that begins with item 83. As determined in the second pass of step 108, the value ($R_X$) of item 83 is hexadecimal "8A", and since item 83 begins row 7 of the uncompressed calibration table 60, item 83 must be accordingly be a code description byte. A code description byte having the hexadecimal value "8A" converts to "10001010" binary, and referring hack to FIG. 2, since bits 7 and 6 of this binary value are "10" and bits 5–0 are "001010", this code description byte is a WORDCODE having ten word-length entries following the code description byte. In this case, since Y and Y+1 (four and five respectively) are both less than the RUN LENGTH of the code description byte "8A", items Y and Y+1 thus correspond to the $4^{th}$ and $5^{th}$ words that follow the code description byte "8A". $C_Y$ is thus "0B31" and $C_{Y+1}$ is "0704" as i FIG. 6A.

Following step 110, algorithm 100 advances to step 112 where control computer 12 is operable to set the ith (=3 in the second pass of algorithm 100) value of the four-element data array, INT, to $C_Y$, or "0B31" and the i+1th (=4 in the first pass of algorithm 100) value of the four-element data array, INT, to $C_{Y+1}$ or "0704". Thereafter at step 114, control computer 12 increments X by 1 and i by 2 and advances to step 116 to test the value of the "i" counter against the value of 5. Since i=5 after the first pass through step 114, step 116 advances from the "YES" branch to step 118 where algorithm 100 terminates When algorithm 100 is complete, the four-element data array, INT, holds $D_{X,Y}$, $D_{X,Y+1}$, $D_{X+1,Y}$, and $D_{X+1,Y+1}$ respectively therein. A known data interpolation or other known data approximation algorithm may then be used to process the four data items to determine a desired result.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected.

Figure 8A:
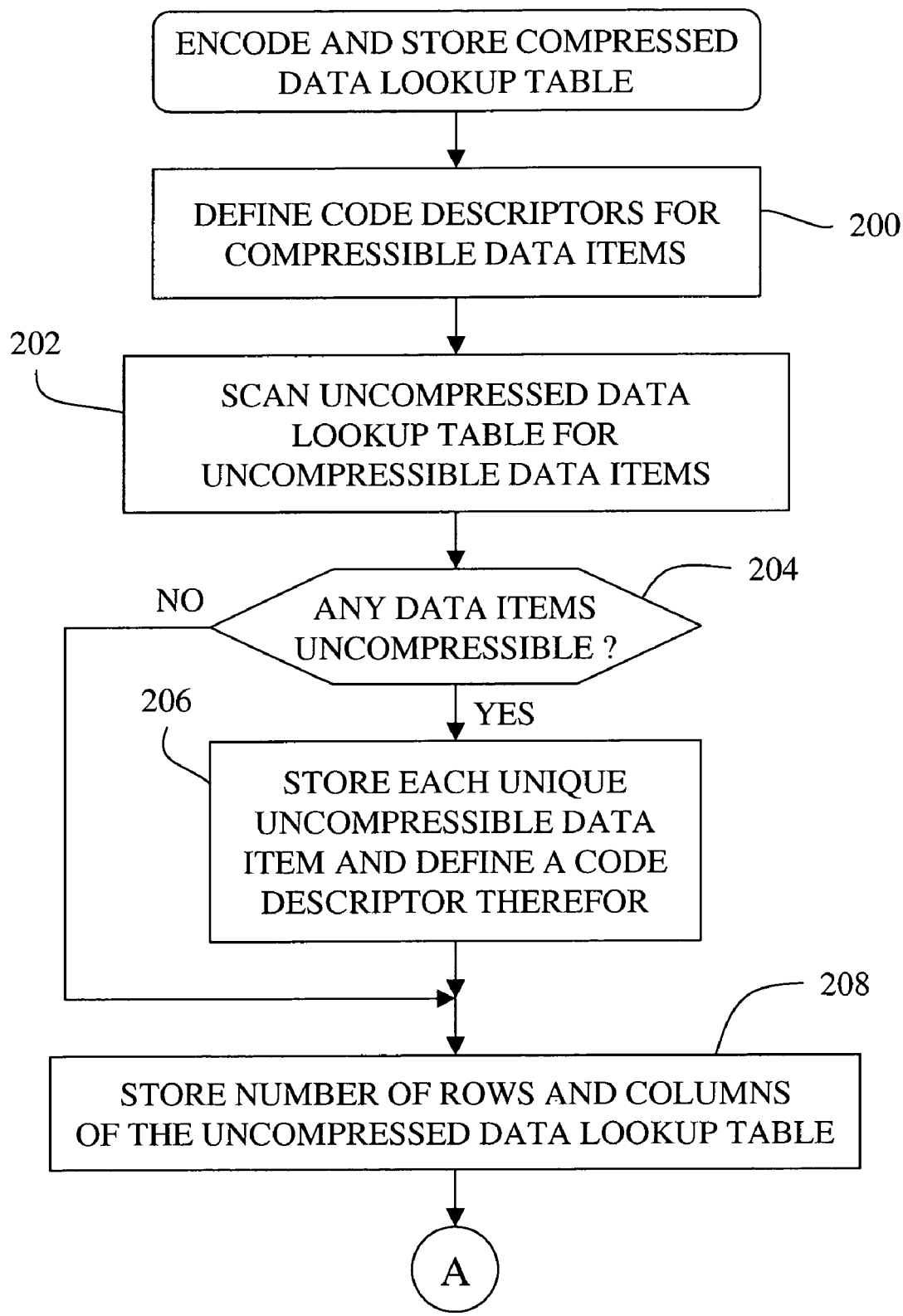
FIG. 8A, FIG. 8B, and FIG. 9 are flowcharts illustrating a preferred embodiment of the method of this invention.
Figure 8B:
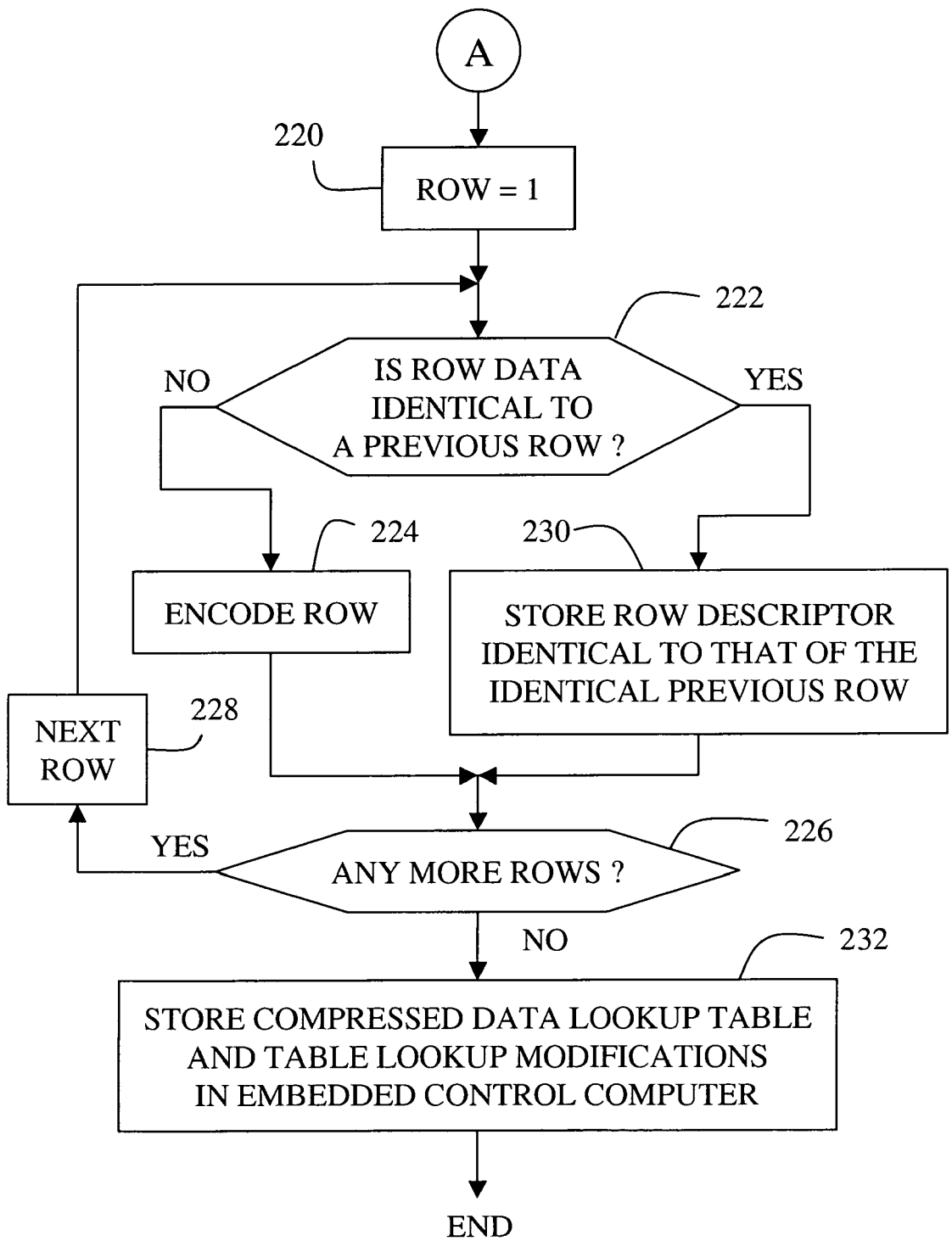
Figure 9:
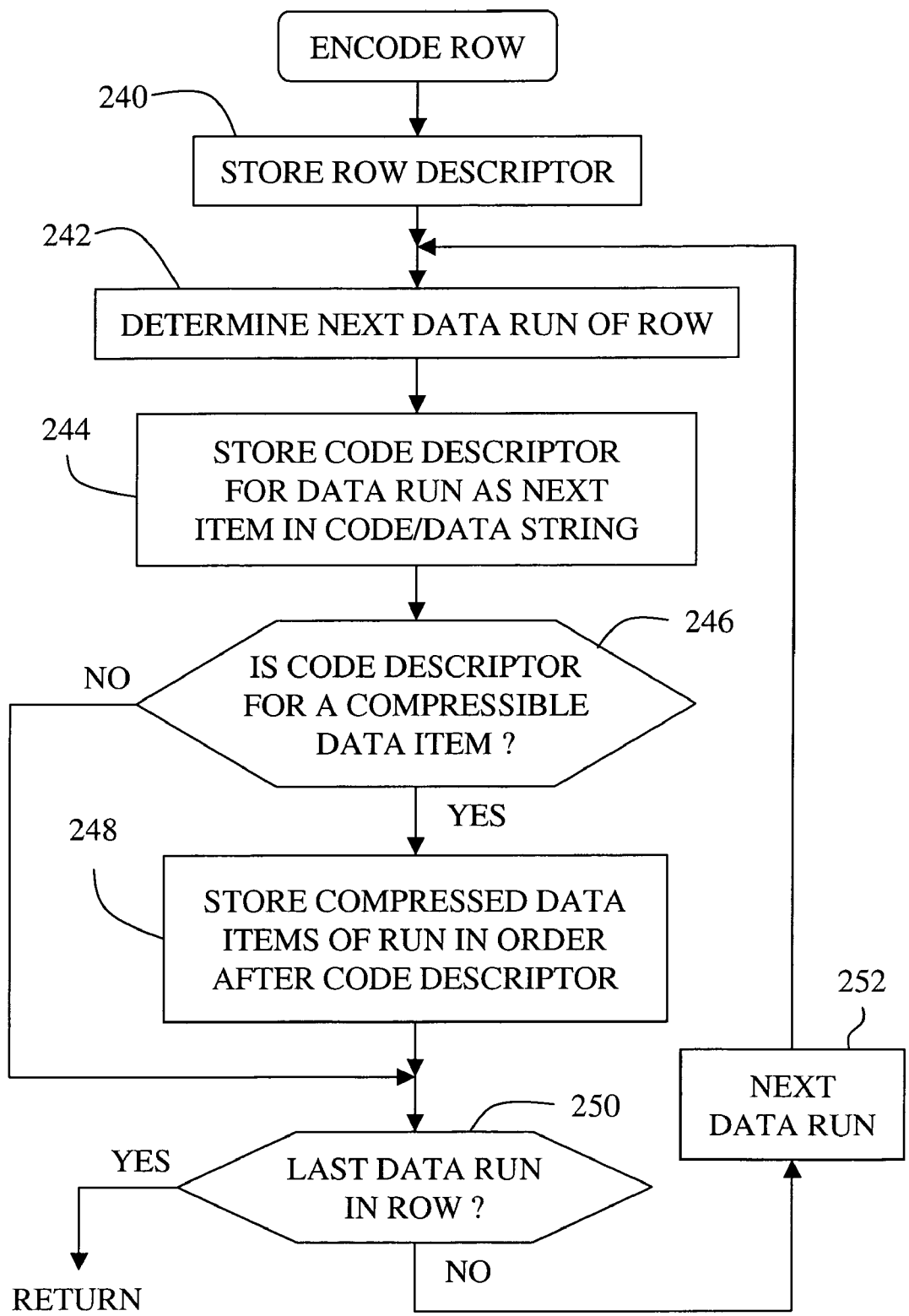

The method of this invention, incorporating the embodiment previously described in detail, may be understood in a more structured sense with reference to the flow charts of FIG. 8A, 8B and 9. In this description and the claims, the term "data lookup table" refers to a data lookup table described in the remainder of this document with the terms "calibration data table" and/or "data table;" and these phrases are to be considered synonymous. The method begins with an uncompressed data lookup table and ends with a compressed data lookup table containing a compressed code/data string and other useful items including a row descriptor array and program modifications enabling location of individual data items directly from the compressed data lookup table using the code descriptors and row descriptor array, as previously described in detail. The flow charts describe a process that may be programmed in a digital computer by one having ordinary skill in the art.

The routine entitled ENCODE AND STORE COMPRESSED DATA LOOKUP TABLE is shown in FIG. 8A and FIG. 8B. It begins at step 200 by defining code descriptors for compressible data items. Each code descriptor is defined for a practitioner-specified bit length of a compressed data item, which length will be less than that reserved for items in the uncompressed data lookup table. Examples are the WORDCODE (16 bit) and BYTECODE (8 bit) code descriptors of the previously described embodiment of compressed data lookup table 70, which are one half and one quarter, respectively, the reserved space of four bytes (32 bits) allotted each data item in the uncompressed data lookup table 60. Each code descriptor itself has a first number of bits specifying its CODE TYPE, as previously described for WORDCODE and BYTECODE code descriptors, and a second number of bits specifying a run length of consecutive occurrences of data items of the same CODE TYPE, so that a run of one or more items of the same CODE TYPE in the uncompressed data lookup table can be represented in the compressed data lookup table by the appropriate code descriptor, followed by compressed versions of the data items in order of their appearance (column order) in the uncompressed data lookup table.

With the code descriptors for compressible data items defined in step 200, the method proceeds at step 202 to scan the uncompressed data lookup table to determine if there are any uncompressible data items. A data item in the uncompressed data lookup table is uncompressible if its significant bits will not fit into the memory space defined by one of the defined code descriptors for compressible data items. For example, the second data item (column 2) of row 5 in uncompressed data lookup table 60 is "00001 F40" (hexadecimal). In binary format, this is "0000 0000 0000 0000 0001 1111 0010 0000". That is, this is the number as it appears in the 32 bit (two word) memory space reserved for a data item of the table. The number itself is actually represented by its significant bits, which begin with the number's most significant—bit the "1" furthest to the left—and proceed rightward to the least significant bit of the memory space. In this case there are 13 significant bits: "11111 0010 0000," and the zeros to the left of the most significant bit represent unused bits of memory space. This number of 13 significant bits is too large to meet the BYTECODE description, which allows only 8 bits for the compressed data item; but it is not too large for the WORD-CODE description allowing 16 bits; so the item is compressible and will be identified with a WORDCODE code descriptor. A complete scan of uncompressed data lookup table 60 finds that most, but not all, data items will fit the definition of the BYTECODE descriptor or the WORD-CODE descriptor and are thus compressible.

If the scan finds any uncompressible data items, from decision point 204 the method proceeds to step 206, wherein each unique uncompressible data item of the uncompressed data lookup table is stored once in the compressed data lookup table in its full uncompressed bit length and an additional code descriptor is defined for its representation in the code/data string of the compressed data lookup table. For example, in the uncompressed data lookup table 60, there is a single unique value of an uncompressible data item "FFFFFFFF" (hexadecimal), which represents a bit string of 32 consecutive ones: "1111 1111 1111 1111 1111 1111 1111 1111." An uncompressed data item is "unique" in its first occurrence only, and additional occurrences are not considered "unique." The code descriptor for an uncompressible data item contains a first number of bits identifying the uncompressed data item, typically by its storage location relative to the remainder of the data in the compressed data lookup table, and a second number of bits defining a run length of its consecutive occurrences in a single row. In the example, the data item "FFFFFFFF" is assigned a code descriptor of SHORTCODE1, as previously described. In this manner, a code descriptor is defined for each such unique uncompressible data item, with each such unique data item stored once in memory outside the compressed code/data string.

From step 206, or from decision point 204 if all data items in the uncompressed data lookup table are compressible, the method proceeds at step 208 to store the number of rows and columns of the uncompressed data lookup table, as previously described. In the example, these numbers (0A hexadecimal for 10 rows and 15 hexadecimal for 21 columns) are stored together at the beginning of the compressed code/data string, but this location is not required, as previously explained.

From step 208, the method proceeds to construct and store in the compressed data lookup table a compressed code/data string and a row descriptor array that will be accessed to retrieve data from the compressed data lookup table. The data string is encoded one row at a time from the uncompressed data lookup table, with the creation of each row proceeding from the first column to the last column of the row in order. An example of the construction of a portion of a table is described in some detail with reference to a portion of the uncompressed data lookup table 60 of FIG. 5, the corresponding compressed data lookup table 70 of FIG. 6A and the row descriptor array of FIG. 6B, but the method will be described here as a structured method of specific steps.

The construction and storage of the compressed code/data string and row descriptor array begins with step 220 of FIG. 8B, wherein a row counter is initiated at "1" to select the first row. The method then proceeds to decision point 222, where it determines if the data in the selected row of the uncompressed data lookup table is identical to that of any previously stored row. In the first call of this subroutine, there have been no previously stored rows; and the answer is clearly "no." The subroutine thus proceeds to step 224, in which it calls a subroutine entitled ENCODE ROW, shown in FIG. 9.

Subroutine ENCODE ROW encodes the currently processed row of the uncompressed data lookup table into the compressed code/data string, one data run at a time in column order, and stores a row descriptor in the row descriptor array that identifies the location of the first code descriptor of the row in the compressed code/data string. It begins at step 240, FIG. 9, by storing a row descriptor for the row in the row descriptor array. The row descriptor is a pointer to the next available memory location of the compressed code/data string, in which will be stored the code descriptor of the first data run (and thus the first data item) of the row.

Next, at step 242, the subroutine determines the next data run of the row, which will be the first data run of the row in this initial loop of the subroutine. To do this, the program determines the most appropriate CODE TYPE for the next unencoded data item and then determines how many (if any) consecutively following data items have the same most appropriate CODE TYPE, determined by whether or not the data item is compressible and if it is, how many significant bits are contained therein, as previously described. For example, in row 6 of the example uncompressed data lookup table 60, the first data item of the row is "00002E00", which is compressible but requires a WORDCODE CODE TYPE. Each of the following data items in the row also requires a word length CODE TYPE until the data item in the tenth column of the row, which is "000000E5." Although this uncompressed data item could be compressed as a WORD-CODE data item, it is most appropriate for a BYTECODE CODE TYPE, since its significant bits will also fit into a smaller, single data byte for maximum compression. Thus the first data run of the row consists of the first nine data items, ending with the WORDCODE data item immediately preceding this tenth data item of the row. At step 244, the subroutine codes the most appropriate code descriptor with the run length of data items having the same CODE TYPE and stores it in the next available memory location as the next item of the compressed code/data string.

Next, at decision point 246, the subroutine determines if the code descriptor is one for compressible (as opposed to uncompressible) data items. If so, the subroutine proceeds, at step 248, to store compressed data items corresponding to each consecutive uncompressed data item in the run. Each compressed data item will consist of the least significant bits of the contents of the associated uncompressed data item in number equal to that specified by the code descriptor: for example, the least significant 16 bits for a WORDCODE CODE TYPE or 8 bits for a BYTECODE CODE TYPE. The values are entered consecutively, in column order from the row in the uncompressed data lookup table, starting immediately after the associated common code descriptor. This completes the coding of a data run of compressible data items. But if the data run is determined at decision point 246 to be that of an uncompressible data item, no data is required following the code descriptor, since it is already stored outside the compressed code/data string. Storage of the code descriptor itself (with run length specified) completes the coding of the data run; and step 248 is bypassed.

With the coded entry of the data run complete, the subroutine determines at decision point 250 if this was the last data run of the row. If it is not, the subroutine determines at step 252 the location of the next data run in the same row of the uncompressed data lookup table and returns to step 244 to encode the next data run. The coding and storage of the row will proceed in this manner until, with the completion of the last data run of the row, decision point 250 will cause a return from this subroutine to step 224 of the subroutine of FIG. 9 from which it was called. It should be noted that, to preserve table lookup speed using the row descriptor array as an index to the rows of the compressed data lookup table, each data run must be confined to a single row, so that the last data run of each row must end at the end of its row, even if one or more data items of the same CODE TYPE begin the next row.

Returning to FIG. 9, the next step after step 224 is step 226, in which it is determined if there are any more rows in the uncompressed data lookup table. If the answer is yes, the subroutine increments the row number to the next row at step 228 and returns to decision point 222. For this second and all remaining rows of the table, the question of step 222 is not trivial, since there are now previous rows to be considered. If the data in the current row is not identical with that of any previous row, the subroutine proceeds to step 224 and calls subroutine ENCODE ROW once again to encode the new row as previously described. But if the data in this row is identical to that in any one or more previous rows, it is already encoded in the compressed code/data string of the compressed data lookup table; and there is thus no need to encode it again. Thus, In this case, at step 230 the subroutine copies the row descriptor of the identical previously encoded row as the row descriptor of the current row in the row descriptor array. The result is that a table lookup for either (or any) of identical rows will be referred to the same row data in the compressed code/data string; and significant compression is thereby obtained.

The method will continue to encode rows of the uncompressed data lookup table into the compressed data lookup table according to the flow chart, encountering the decision of step 226 at the end of the encoding of each row. When decision point 226 finally indicates that all rows of the uncompressed data lookup table have been processed, the method proceeds to the last step 232 and stores the entire compressed data lookup table in embedded control computer 12, if it has not already been so stored, for use by the embedded computer in controlling a machine by means of the calibration numbers in the table. The compressed data lookup table includes a compressed code/data string, a row descriptor array, the number of rows and columns in the uncompressed data lookup table, any unique uncompressible data items and specification of their code descriptors. This compressed data lookup table will be stored in the memory of embedded control computer 12 (to the extent it is not already so stored) to provide the calibration data required for its management of the controlled machine. In addition, the table lookup software modifications of FIG. 7 will also be stored in the memory of computer 12 if they are not already present. These modifications and/or additions enable the already programmed table lookup software of the machine control computer, using code descriptors and the row descriptor array, to directly address and retrieve individual data items from the compressed data lookup table by their row and column location in the uncompressed data lookup table by specifying row and column numbers, just as if the stored table were actually the uncompressed data lookup table.

The invention claimed is:

1. A method of compressing digital data from an uncompressed data lookup table into an encoded, addressable, compressed data lookup table and storing the compressed data lookup table in a memory of a machine control computer, the uncompressed data lookup table comprising a plurality of uncompressed numerical data items having a single predetermined uncompressed data bit length in a row/column structure and the machine control computer being programmed to perform data lookup procedures with specification of a row and column of the uncompressed data lookup table, the method comprising the steps:

scanning the uncompressed data lookup table for compressible and uncompressible data items, defining a plurality of code descriptors for compressible data items, each of the code descriptors having a first predetermined number of bits describing a code type and a second predetermined number of bits for defining a run length of data items, each of the code types specifying a different compressed data item bit length less than the single predetermined uncompressed data bit length;

for each unique uncompressible data, storing the unique uncompressible data item in the compressed data lookup table and defining a code descriptor for the unique uncompressible data item having a first predetermined number of bits identifying the memory location of the stored unique uncompressible data item and a second predetermined number of bits for defining a run length of the unique uncompressible data item encoding and storing in the compressed data lookup table data specifying the number of rows and the number of columns of the uncompressed data lookup table;

generating and storing in the compressed data lookup table an encoded code/data string by encoding and storing each row of uncompressed data items in the uncompressed data lookup table that is not identical to a previously encoded and stored row according to the following steps, beginning at the first column of the row:

(a) beginning with the next uncompressed data item in the row that has not been encoded, determining a run of consecutive uncompressed data items within the row for which a single one of the code descriptors is most appropriate and storing the most appropriate code descriptor encoded with the run length of the determined run, (b) if and only if the stored most appropriate code descriptor is a code descriptor for compressible items, storing compressed data items for the run following the code descriptor in column order, each of the compressed data items having a bit length equal to the bit length indicated by the code type thereof and including all significant bits of the corresponding uncompressed data item; and (c) repeating steps (a) and (b) to the end of the row; and assembling and storing in the compressed data lookup table a row descriptor array comprising the locations in the compressed code data string of the code descriptors associated with the first uncompressed data item of each row, with the entry in the array for any row of the uncompressed data lookup table that is omitted being the same as that of the previous encoded and stored row to which it is identical, whereby the row descriptor array provides indexing of the initial column of each row of the compressed data lookup table for a table lookup operation with a specified row and column; and storing the compressed data lookup table in the memory of a machine control computer.

2. The method of claim 1 wherein, for code types used in encoding a compressible data item, the most appropriate code type is that which specifies the smallest of the compressed data item bit lengths able to contain all the significant numerical bits of the uncompressed data item.

3. The method of claim 1 further comprising the step of storing in the memory of a machine control computer program modifications enabling location of a compressed data item by specification of its row and column in the uncompressed data lookup table using the code descriptors and the row descriptor array.

4. The method of claim 1 wherein the single predetermined uncompressed data bit length for all data items is greater than two bytes and the plurality of code descriptors comprises at least one having a bit length of one byte and another having a bit length of two bytes.

* * * * *